United States Patent
Watanabe et al.

(10) Patent No.: US 10,126,388 B2
(45) Date of Patent: Nov. 13, 2018

(54) GRADIENT COIL UNIT AND MAGNETIC RESONANCE IMAGING APPARATUS

(71) Applicant: TOSHIBA MEDICAL SYSTEMS CORPORATION, Otawara-shi, Tochigi (JP)

(72) Inventors: Kota Watanabe, Tochigi (JP); Hiromitsu Takamori, Tochigi (JP); Yu Ueda, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 485 days.

(21) Appl. No.: 14/815,104

(22) Filed: Jul. 31, 2015

(65) Prior Publication Data

US 2015/0338481 A1  Nov. 26, 2015

Related U.S. Application Data

(63) Continuation of application No. PCT/JP2014/051751, filed on Jan. 28, 2014.

(30) Foreign Application Priority Data

Feb. 1, 2013  (JP) .................................. 2013-019008

(51) Int. Cl.
*G01V 3/00* (2006.01)
*G01R 33/385* (2006.01)

(52) U.S. Cl.
CPC ...... *G01R 33/3854* (2013.01); *G01R 33/3858* (2013.01)

(58) Field of Classification Search
CPC .................................................. G01R 33/3858
(Continued)

(56) References Cited

U.S. PATENT DOCUMENTS 6,160,399 A * 12/2000 Radziun ............... G01R 33/385
324/319
7,567,082 B2   7/2009 Takamori
(Continued)

FOREIGN PATENT DOCUMENTS

CN       101393254 A     3/2009
JP       2005-245775     9/2005
(Continued)

OTHER PUBLICATIONS

Chinese office action dated Apr. 28, 2017, in Patent Application No. CN 201480006927.4.
(Continued)

*Primary Examiner* — Louis Arana
(74) *Attorney, Agent, or Firm* — Nixon & Vanderhye P.C.

(57) ABSTRACT

A gradient coil unit includes a tubular gradient coil and support structures. The tubular gradient coil is configured to apply a gradient magnetic field to an imaging region of magnetic resonance imaging. The support structures are fixed to plural positions of the gradient coil. The support structures are configured to hold the gradient coil on a tubular magnet by applying pressing forces on positions of an edge inside a wall forming the magnet. The pressing forces each has a component in a central axis direction of the magnet. Further, according to another embodiment, a magnetic resonance imaging apparatus includes the above mentioned gradient coil unit, a static field magnet and at least one radio frequency coil configured to perform magnetic resonance imaging of an object.

13 Claims, 13 Drawing Sheets

(58) Field of Classification Search
USPC .................................. 324/318, 322
See application file for complete search history.

(56) References Cited

U.S. PATENT DOCUMENTS

| | | | |
|---|---|---|---|
| 7,816,919 B2 | 10/2010 | Yamashita | |
| 2015/0048827 A1* | 2/2015 | Watanabe | G01R 33/3858 324/318 |
| 2015/0091575 A1* | 4/2015 | Kralick | G01R 33/3858 324/322 |

FOREIGN PATENT DOCUMENTS

| | | |
|---|---|---|
| JP | 2007-190200 | 8/2007 |
| JP | 2009-90101 | 4/2009 |

OTHER PUBLICATIONS

International Search Report for PCT/JP2014/051751, dated Apr. 15, 2014, two pages.
Written Opinion of the ISA for PCT/JP2014/051751, dated Apr. 15, 2014, four pages.
Notification of Transmittal of Translation of the International Preliminary Report on Patentability in PCT/JP2014/051751 dated Aug. 13, 2015.
Second Chinese office action dated Mar. 9, 2018, in Patent Application No. CN 201480006927.4.
Third Chinese office action dated Sep. 12, 2018, in Patent Application No. CN 201480006927.4.

* cited by examiner

US 10,126,388 B2

GRADIENT COIL UNIT AND MAGNETIC RESONANCE IMAGING APPARATUS

CROSS REFERENCES TO RELATED APPLICATIONS

This is a continuation of Application PCT/JP2014/51751, filed on Jan. 28, 2014.

This application is based upon and claims the benefit of priority from Japanese Patent Application No. 2013-019008 filed on Feb. 1, 2013; the entire contents of which are incorporated herein by reference.

FIELD

Embodiments described herein relate generally to a gradient coil unit and an MRI (magnetic resonance imaging) apparatus.

BACKGROUND

The MRI apparatus is an imaging diagnostic apparatus which magnetically excites nuclear spins of an object set in a static magnetic field with RF (radio frequency) signals having the Larmor frequency and reconstructs images based on MR (magnetic resonance) signals generated due to the excitation.

Conventionally, a cylindrical gradient coil, which is one of elements of an MRI apparatus, is placed in a bore of a cylindrical static field magnet. The gradient coil is supported by brackets attached to the both lateral sides of the static field magnet, each forming an open end of the magnet.

It is important to reduce a vibration and a noise of an MRI apparatus.

Accordingly, an object of the present invention is to provide a gradient coil unit and an MRI apparatus which can reduce a vibration and a noise.

PRIOR TECHNICAL LITERATURE

[Patent literature 1] JPA 2007-190200
[Patent literature 2] JPA 2005-245775

DETAILED DESCRIPTION

In general, according to one embodiment, a gradient coil unit includes a tubular gradient coil and support structures. The tubular gradient coil is configured to apply a gradient magnetic field to an imaging region of magnetic resonance imaging. The support structures are fixed to plural positions of the gradient coil. The support structures are configured to hold the gradient coil on a tubular magnet by applying pressing forces on positions of an edge inside a wall forming the magnet. Each pressing force each has a component in a central axis direction of the magnet.

Further, according to another embodiment, a magnetic resonance imaging apparatus includes the above mentioned gradient coil unit, a static field magnet and at least one radio frequency coil configured to perform magnetic resonance imaging of an object.

A gradient coil unit and an MRI apparatus according to embodiments of the present invention will be described with reference to the accompanying drawings.

Figure 1:
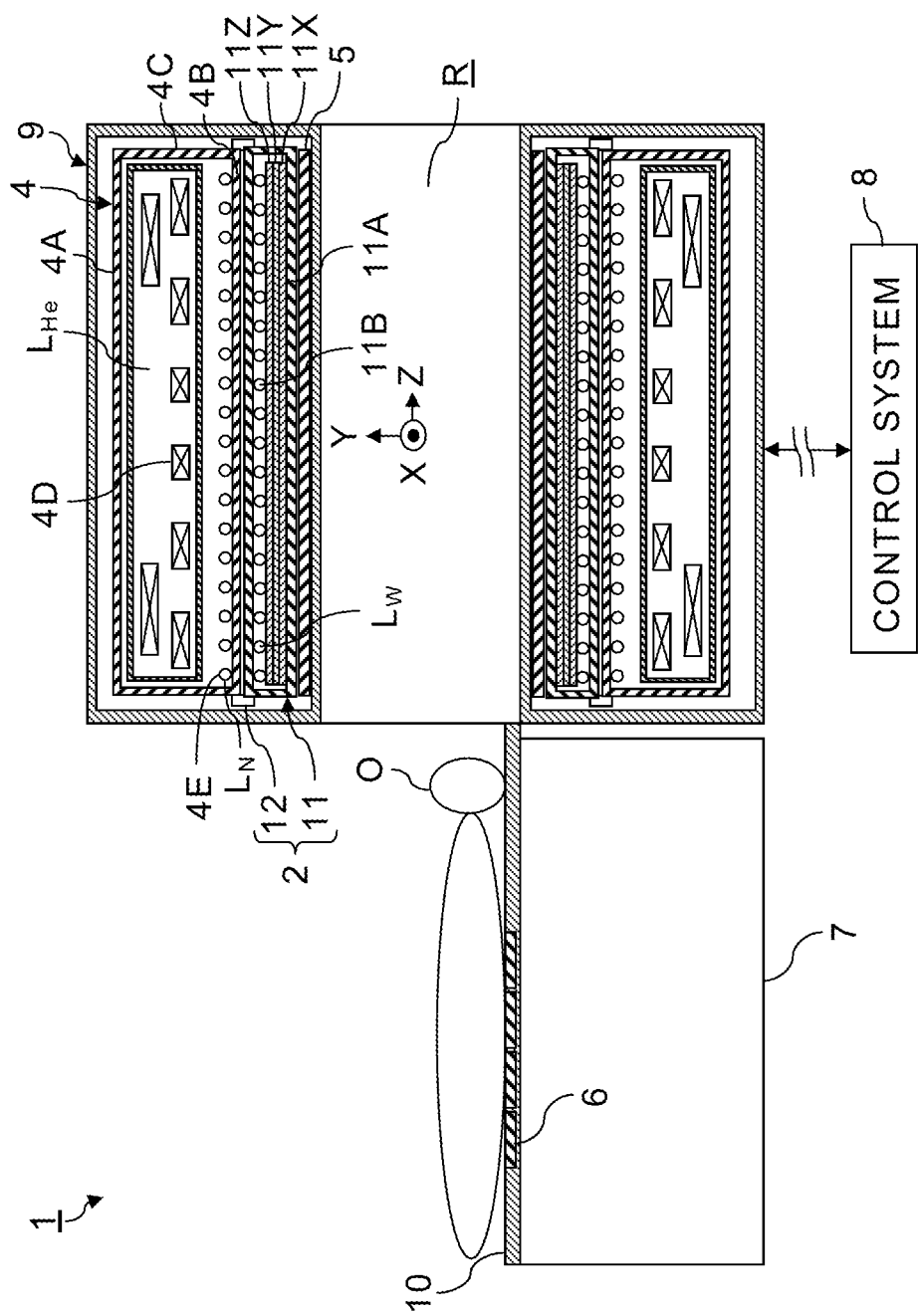
FIG. 1 is a structural drawing of a gradient coil unit and an MRI apparatus according to an embodiment of the present invention.

FIG. 1 is a structural drawing of a gradient coil unit and an MRI apparatus according to an embodiment of the present invention.

An MRI apparatus 1 includes an imaging system which performs MR imaging of an object O using a gradient coil unit 2. The imaging system includes a magnet 4, a whole body coil 5, reception RF coils 6, a bed 7 and a control system 8 for controlling the above-mentioned elements, in addition to the gradient coil unit 2. The magnet 4, the gradient coil unit 2 and the whole body coil 5 of the imaging system, each having a cylindrical structure, are coaxially built in a gantry 9. The reception RF coils 6 are set on a position according to an imaging purpose, for example, on a top plate 10 of the bed 7.

The magnet 4 is a superconducting magnet, which has a cylindrical structure, for forming a static magnetic field in an imaging region R of MR imaging. A cylindrical type of superconducting magnet is exemplified in FIG. 1. Specifically, the magnet 4 includes a cylindrical external cylinder member 4A, forming an external wall of the magnet 4, and a cylindrical internal cylinder member 4B, forming an internal wall of the magnet 4, which are closed by end face members 4C at both ends. Circular superconductive coils 4D cooled by liquid helium LHe are arranged between the external cylinder member 4A and the internal cylinder member 4B of the magnet 4. Furthermore, pipes 4E for circulating liquid nitrogen $L_N$ as a cooling medium are typically arranged between the external cylinder member 4A and the internal cylinder member 4B.

The gradient coil unit 2 has a tubular gradient coil 11, for applying gradient magnetic fields to the imaging region R of MR imaging, and support structures 12 for holding the gradient coil 11 on the magnet 4.

The gradient coil 11 includes a tubular X-axis coil 11X, Y-axis coil 11Y and Z-axis coil 11Z. The X-axis coil 11X, the Y-axis coil 11Y and the Z-axis coil 11Z are shielded by a hollow and tubular casing 11A. The typical gradient coil 11 has pipes 11B in the casing 11A so as to circulate cooling water $L_W$. Furthermore, a cancel coil having a reverse polarity to the polarity of the magnet 4 are sometimes arranged, in the casing 11A, as a shield for improving uniformity of the static magnetic field. The gradient coil 11 having such a cancel coil is called an ASGC (active shield gradient coil).

Figure 2:
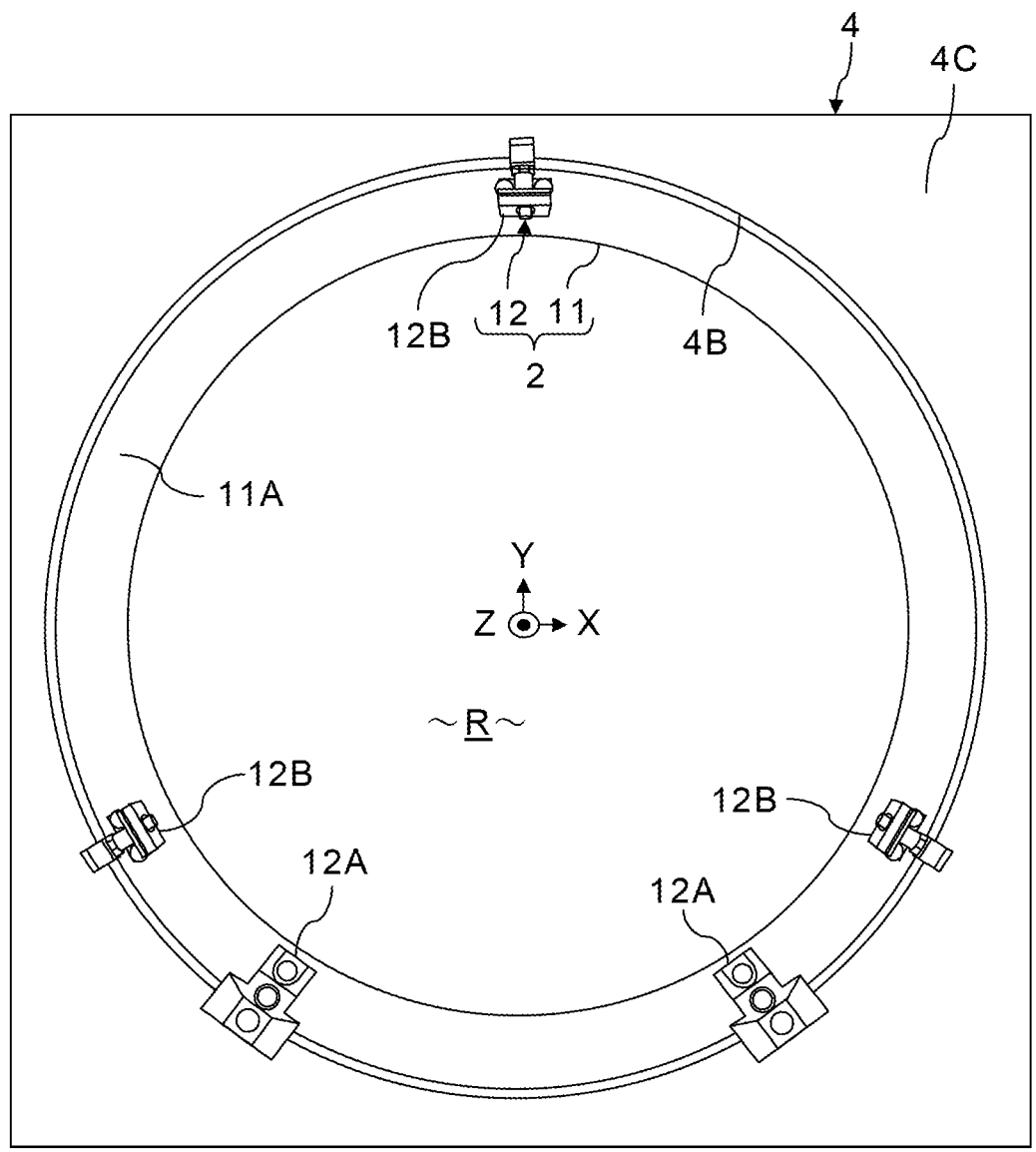
FIG. 2 is a view showing an example of arrangement of the support structures shown in FIG. 1.

FIG. 2 is a view showing an example of arrangement of the support structures 12 shown in FIG. 1.

FIG. 2 is a view of the magnet 4 and the gradient coil 11 as viewed from a lateral side direction. As shown in FIG. 2, the gradient coil 11 can be held on the magnet 4 using the first support structures 12A and the second support structures 12B as the support structures 12.

Specifically, the first support structures 12A and the second support structures 12B are fixed to different positions of the gradient coil 11. Then, the first support structures 12A and the second support structures 12B are configured to apply pressing forces, each having a component in the central axis direction of the magnet 4, on different positions of edges inside a wall forming the tubular magnet 4. Meanwhile, the first support structures 12A and the second support structures 12B are configured to apply pulling forces, each having a component in the central axis direction of the magnet 4, on the gradient coil 11. Thereby, the gradient coil 11 can be held on the magnet 4.

Firstly, an example of structure of the first support structure 12A will be described.

Figure 3:
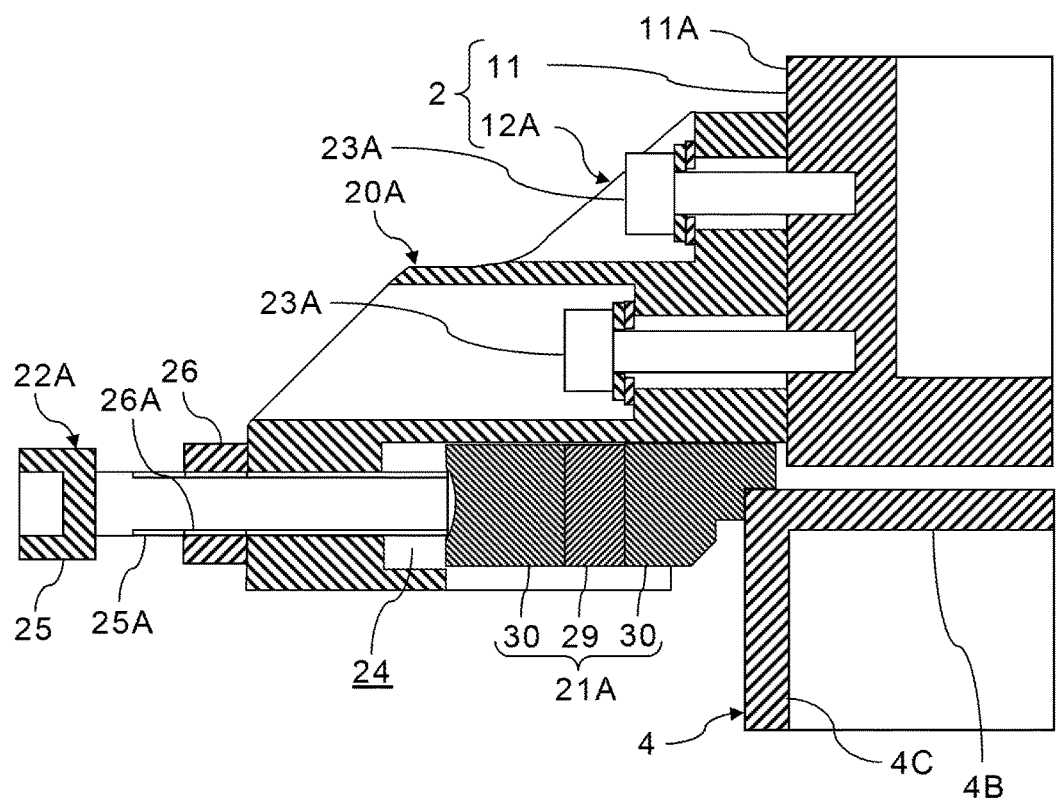
FIG. 3 is a sectional view showing an example of detailed structure of the first support structure shown in FIG. 2.
Figure 4:
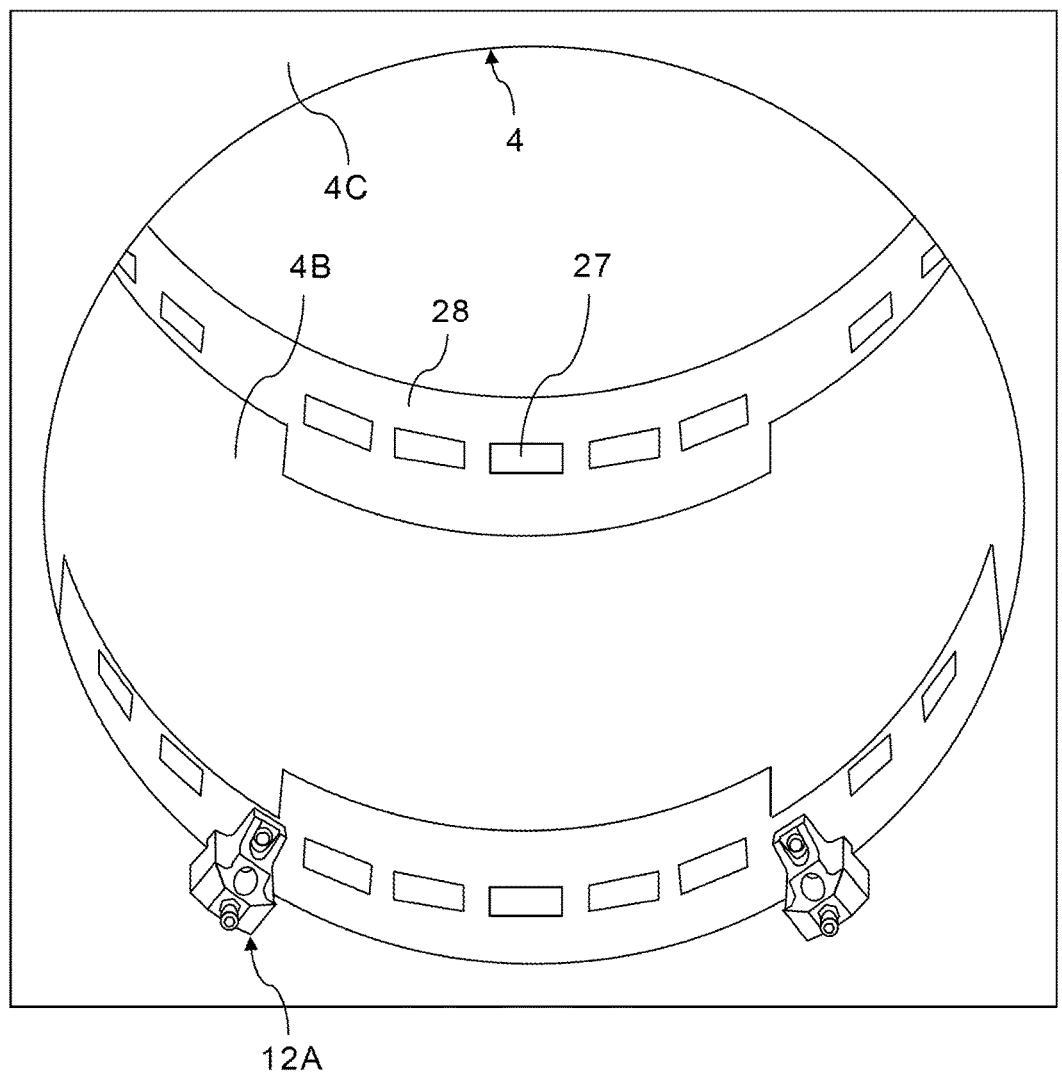
FIG. 4 is a perspective view of the first support structure shown in FIG. 3.
Figure 5:
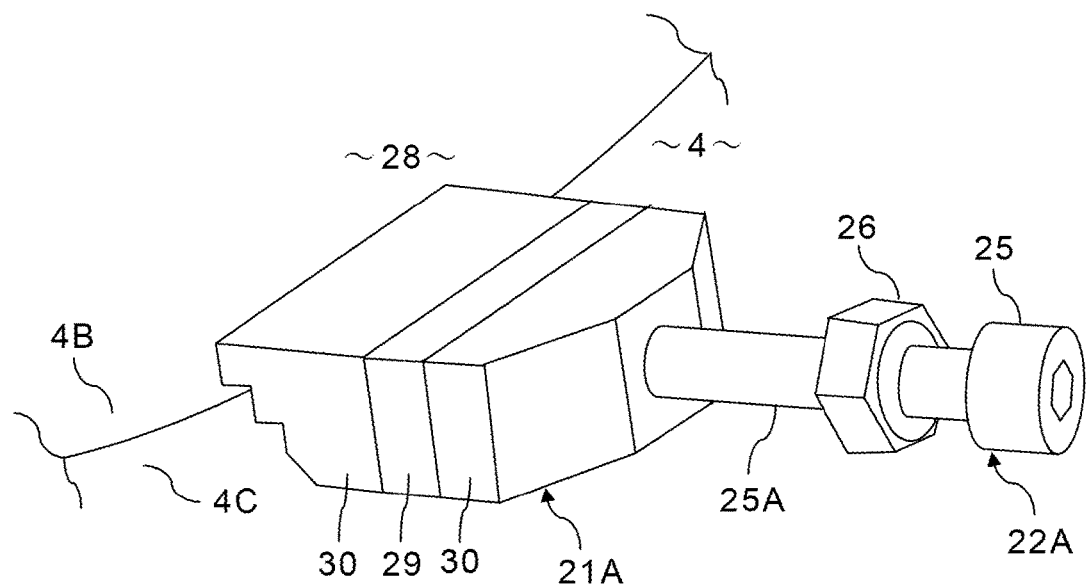
FIG. 5 is a perspective view of the second member, in the magnet side, shown in FIG. 3.

FIG. 3 is a sectional view showing an example of detailed structure of the first support structure 12A shown in FIG. 2, FIG. 4 is a perspective view of the first support structure 12A shown in FIG. 3, and FIG. 5 is a perspective view of the second member, in the magnet 4 side, shown in FIG. 3. Note that, illustration of the gradient coil 11 is omitted in FIG. 4 and FIG. 5.

Each of the first support structures 12A can be composed of the first member 20A, the second member 21A and a positioning structure 22A. The first member 20A is fixed to the gradient coil 11 side in an arbitrary method. In the illustrated example, the first member 20A has been fastened to the gradient coil 11 side by bolts 23A.

The second member 21A is arranged at a position at which the second member 21A contacts with the edge inside the wall forming the magnet 4. Therefore, the second member 21A has a shape fitting the edge inside the wall forming the magnet 4. In the illustrated example, the end part of the internal cylinder member 4B has a shape without a chamfer. Thus, the second member 21A also has a shape without a chamfer, in the internal cylinder member 4B side. Furthermore, the shape of the second member 21A in the internal cylinder member 4B side can be determined so as to fit other components.

Figure 6:
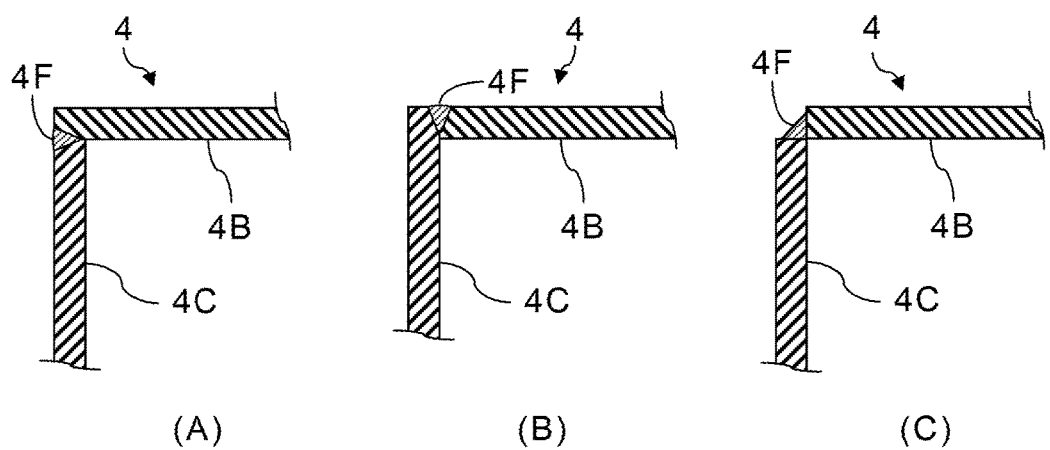
FIG. 6 shows examples of structure of the edge of the magnet formed by the internal cylinder member and the end face member which are shown in FIG. 3.

FIG. 6 shows examples of structure of the edge of the magnet 4 formed by the internal cylinder member 4B and the end face member 4C which are shown in FIG. 3.

Each of (A), (B), and (C) of FIG. 6 shows an example of structure of the edge of the magnet 4 when the internal cylinder member 4B have been connected with the end face member 4C by a weld 4F. As shown in (A) of FIG. 6, the end part of the cylindrical lateral face of the internal cylinder member 4B, perpendicular to its thickness direction, can be connected with the ring-shaped face of the end face member 4C, parallel to its thickness direction, by the weld 4F. Alternatively, as shown in (B) of FIG. 6, the ring-shaped end face of the internal cylinder member 4B, parallel to its thickness direction, can be connected with a ring-shaped end part of the face of the end face member 4C, perpendicular to its thickness direction, by the weld 4F.

As further another example shown in (C) of FIG. 6, the internal cylinder member 4B can also be connected with the end face member 4C by the weld 4F so that the internal cylinder member 4B does not contact or slightly contacts with the end face member 4C.

As described above, each edge inside the wall forming the magnet 4 is formed by the corner portion of the internal cylinder member 4B, the corner portion of the end face member 4C or both the corner portions of the internal cylinder member 4B and the end face member 4C. Therefore, the second member 21A included in each of the first support structures 12A is configured to apply a pressing force on an end part of at least one of the internal cylinder member 4B and the end face member 4C which form the magnet 4. That is, a pressing force is applied on an end part of the internal cylinder member 4B directly or indirectly by each of the first support structures 12A.

The first member 20A is connected with the second member 21A in an arbitrary method. In the illustrated example, the first member 20A has a space 24 so that the second member 21A can be inserted slidably in the central axis direction of the magnet 4. Then, the second member 21A is inserted in the space 24 of the first member 20A.

The positioning structure 22A can be configured using a positioning bolt 25 and a nut 26, for example. The first member 20A has a through hole for inserting the tip of the positioning bolt 25 into the space 24 from the outside of the first member 20A. The nut 26 for fastening the positioning bolt 25 is attached to the first member 20A. The nut 26 and the through hole are arranged on the first member 20A so that the length direction of the positioning bolt 25 becomes the central axis direction of the magnet 4.

Therefore, the tip of the positioning bolt 25 can be pressed against the second member 21A with fastening the positioning bolt 25 with the nut 26. Hence, a pressing force in the central axis direction of the magnet 4 can be applied on the edge of the magnet 4 by fastening the positioning bolt 25. On the contrary, a pulling force toward the central axis direction can be applied on the gradient coil 11. Thus, positioning and fixing the gradient coil 11 in the length direction can be performed by applying the above-mentioned compressive forces and pulling forces on the edges of the magnet 4 and the gradient coil 11 respectively from both end sides.

In the usual MRI apparatus 1, the central axis direction of the magnet 4 and the gradient coil 11 is the horizontal direction. Therefore, positioning and fixing the gradient coil 11, in the horizontal direction, relative to the magnet 4 can be performed by arranging the first support structures 12A at both ends of the magnet 4 and the gradient coil 11. In the example shown in FIG. 1, the central axis direction of the magnet 4 and the gradient coil 11 is set in the Z-axis direction.

On the other hand, support members 27 of the gradient coil 11 are attached on the inner face of the magnet 4 as shown in FIG. 4 in order to support the load of the gradient coil 11 in the vertical direction. It is preferable to use a cushion, such as a rubber or an elastomer, as each support member 27 since the cushion functions as a vibration-proof material.

In the example shown in FIG. 4, a sheet 28, such as an FRP (fiber reinforced plastics) or a GFRP (glass fiber reinforced plastics), as a substrate has been stuck on the surface of the internal cylinder member 4B. Then, the support members 27 are attached on the sheet 28 in the circumferential direction. An arbitrary method, such as using a double-sided tape, can be used for attaching the support members 27 on the sheet 28.

As described above, the support members 27 receive the load of the gradient coil 11. Therefore, the position of the gradient coil 11 can be adjusted by the first support structures 12A. Specifically, the positioning of the gradient coil 11 in the longitudinal direction can be performed by adjusting fastening amounts of the positioning bolts 25 of the first support structures 12A attached to both sides of the gradient coil 11.

That is, a female screw 26A formed on the first member 20A side and a male screw 25A, which is fastened with the female screw 26A and contacts with the second member 21A, formed on the positioning bolt 25 are an example of movable structure for positioning the first member 20A to the second member 21A at least in the central axis direction of the gradient coil 11 and the magnet 4. Note that, another structure may be adopted as the movable structure as long as the structure can move the first member 20A relative to the second member 21A in the central axis direction of the gradient coil 11 and the magnet 4.

When the movable structure consists of the female screws 26A and the male screws 25A, it is preferable to form a curved contact face, for contacting with the second member 21A, at the tip of each male screw 25A. The reason is that forces can be transferred stably. In the example shown in FIG. 3, the tip of the male screw 25A has a convex shape which is a part of a spherical face. On the contrary, the portion of the second member 21A contacting with the tip of the male screw 25A has a concave shape which is a part of a spherical face.

In order to perform the positioning of the gradient coil 11 in the length direction, it is necessary to set at least one support structure 12 at each end of the gradient coil 11. Therefore, the first support structures 12A may be set on one end side of the gradient coil 11 while the support structures 12 having another structure may be set on the other end side.

When the single support structure 12 having the positioning function is set at each end of the gradient coil 11, adjusting the gradient coil 11 becomes easy. However, in order to apply a sufficient pressing force on the magnet 4 with making the support structure 12 compact in size, it is often necessary to set the plural support structures 12 on one side of the gradient coil 11. In that case, a sufficient number of the support structures 12 are attached to both ends of the gradient coil 11 with avoiding interference with other parts, respectively. In the illustrated example, the two first support structures 12A and the three second support structures 12B have been attached to each end of the gradient coil 11.

Other preferable features of the first support structure 12A include a point that at least a part of the first support structure 12A consists of a vibration-proof material 29 and a point that at least a member contacting with the magnet 4 consists of a nonconductive material 30. For example, the second member 21A can have a structure that the vibration-proof material 29 is placed between the two nonconductive materials 30 as illustrated. When a portion or portions in contact with or close to the magnet 4 are made with the nonconductive material 30 as described above, generation of noises due to a vibration can be prevented. In addition, even when a vibration occurs, the vibration can be absorbed by the vibration-proof material 29.

Typical examples of the vibration-proof material 29 include an elastic body, such as CR (chloroprene rubber). Meanwhile, typical examples of the nonconductive material 30 include a resin, such as POM (polyoxymethylene) which is also called polyacetal.

Next, an example of structure of the second support structure 12B will be described.

Figure 7:
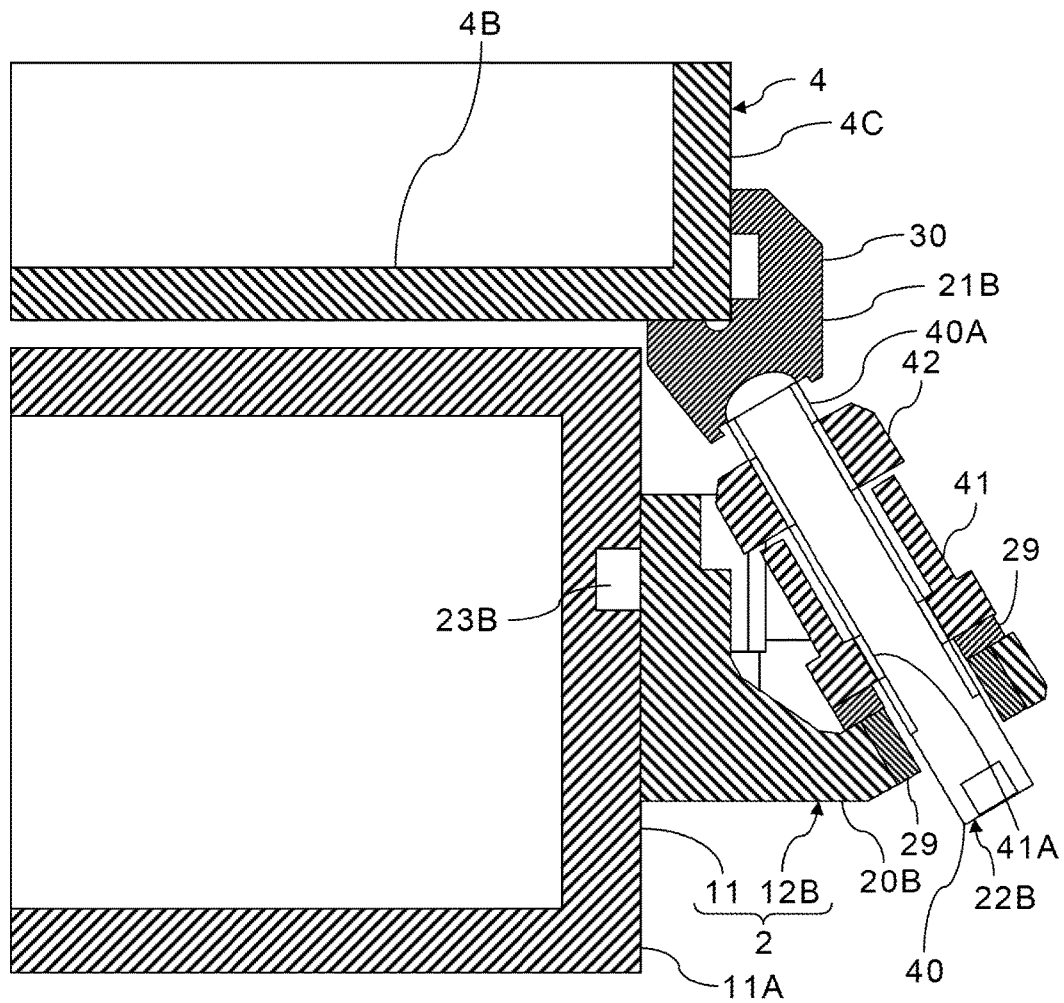
FIG. 7 is a sectional view showing an example of detailed structure of the second support structure shown in FIG. 2.
Figure 8:
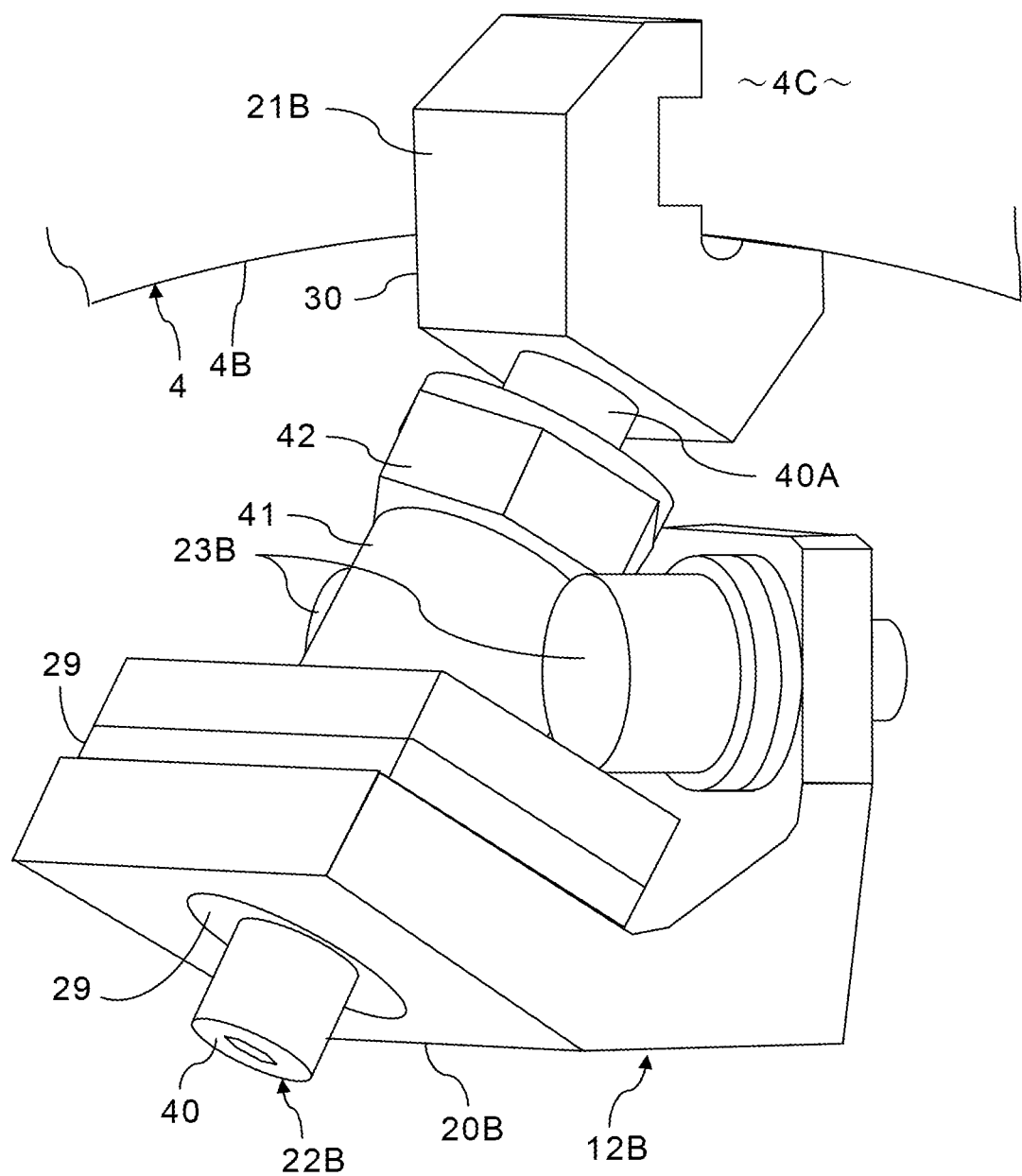
FIG. 8 is a perspective view of the second support structure shown in FIG. 7.

FIG. 7 is a sectional view showing an example of detailed structure of the second support structure 12B shown in FIG. 2, and FIG. 8 is a perspective view of the second support structure 12B shown in FIG. 7.

Each of the second support structures 12B can also be composed of the first member 20B, the second member 21B and a positioning structure 22B. The first member 20B is fixed to the gradient coil 11 side in an arbitrary method. In the illustrated example, the first member 20B has been fastened to the gradient coil 11 side by bolts 23B.

The second member 21B is arranged at a position at which the second member 21B contacts with the edge inside the wall forming the magnet 4. The first member 20B is connected with the second member 21B in an arbitrary method. In the illustrated example, the first member 20B is connected with the second member 21B by the positioning structure 22B.

The positioning structure 22B can be configured using a positioning bolt 40, a positioning nut 41 and a fixing nut 42. The positioning nut 41 has a structure in which a female screw has been formed on an inner face of one end of a tubular member whose both ends open.

The first member 20B has a through hole for inserting the positioning bolt 40. The through hole of the first member 20B is formed at and in such a position and a direction that the tip of the positioning bolt 40 contacts with the second member 21B in a state where the positioning bolt 40 is inclined.

Then, the positioning bolt 40 is inserted in the through hole of the first member 20B, and a female screw 41A of the positioning nut 41 is fastened from the tip side of the positioning bolt 40. At this time, the female screw 41A of the positioning nut 41 is fastened to a male screw 40A of the positioning bolt 40 so that the female screw 41A side of the positioning nut 41 becomes the first member 20B side. Furthermore, the fixing nut 42 is fastened to the male screw 40A of the positioning bolt 40 protruding from the positioning nut 41. Then, the tip of the positioning bolt 40 protruding from the fixing nut 42 contacts with a concave formed in the second member 21B.

Therefore, the more the positioning bolt 40 is fastened by the positioning nut 41, the longer the protrusion length of the positioning bolt 40 becomes. As a result, the second member 21B is pressed by the positioning bolt 40 with a stronger force from an oblique direction. Then, the fixing nut 42 is fastened with a sufficient torque in a state where a sufficient pressing force has acted on the second member 21B by the positioning bolt 40. Thus, the end part of the positioning nut 41 in the side where the female screw 41A is not formed becomes a receiving face of the fixing nut 42, thereby the positioning bolt 40, the positioning nut 41 and the fixing nut 42 are firmly fixed to the second member 21B.

That is, the second support structure 12B is configured to apply a pressing force on the edge inside the wall forming the magnet 4, at an inclined angle from the central axis direction of the magnet 4. Therefore, a pressing force including two component forces in the central axis direction (the Z-axis direction) of the magnet 4 and a radial direction perpendicular to the central axis acts on the edge of the magnet 4 from the second support structure 12B. Therefore, the second support structure 12B applies an outward force, in the radial direction of the cross section of the magnet 4, on the end face member 4C, which closes up the interspace between the external cylinder member 4A and the internal cylinder member 4B of the magnet 4, not as a shear force but as a compressive force.

On the contrary, the second support structure 12B applies a pulling force in the central axis direction (the Z-axis direction) of the magnet 4 and a pressing force toward the center in a radial direction perpendicular to the central axis of the magnet 4, on the gradient coil 11 from the bolts 23B.

The second support structures 12B can also perform the positioning of the gradient coil 11 by adjusting fastening amounts of the positioning bolts 40 and the positioning nuts 41. That is, the female screw 41A of the positioning nut 41 formed in the first member 20B side and the male screw 40A, which is fastened with the female screw 41A and contacts with the second member 21B, of the positioning bolt 40, are an example of movable structure for positioning the first member 20B relative to the second member 21B at least in the central axis direction of the gradient coil 11 and the magnet 4.

The positioning bolt 40 of the second support structure 12B contacts with the second member 21B in a state where the length direction of the positioning bolt 40 is inclined. Therefore, the female screw 41A of the positioning nut 41 and the male screw 40A of the positioning bolt 40 are also an example of movable structure for positioning the first member 20B relative to the second member 21B in a radial direction perpendicular to the central axis of the gradient coil 11 and the magnet 4.

Note that, another structure may be adopted as the movable structure as long as the structure can move the first member 20B relative to the second member 21B in the central axis direction of the gradient coil 11 and the magnet 4 and a direction perpendicular to the central axis.

As described above, the second support structure 12B has a structure stretching the gradient coil 11 using an edge portion inside the magnet 4 as a support position. Therefore, when the second support structures 12B are arranged at not less than three positions which lie on vertices of an acute triangle, a centering function of the gradient coil 11 can be obtained. Furthermore, even when the second support structures 12B are not arranged at vertices of an acute triangle, the centering function in one direction of the gradient coil 11 can be obtained by arranging the two second support structures 12B at line-symmetric positions.

As a specific example, when the two second support structures 12B for one side are arranged on the XZ plane involving the Z-axis, set as the central axis of the magnet 4, and the horizontal X-axis, which is orthogonal to the Z-axis at the center of a magnetic field, the centering of the gradient coil 11 in the X-axis direction can be performed. Furthermore, when the second support structures 12B are arranged at positions opposing the support members 27 which support the load of the gradient coil 11, a vibration of the gradient coil 11 in the Y-axis direction, which is orthogonal to both of the X-axis and the Z-axis at the center of a magnetic field, can be suppressed. Therefore, effects including improving an image quality of MR image by the centering of the gradient coil 11 and preventing a vibration of the gradient coil 11 can be obtained by arranging the second support structures 12B at appropriate positions.

In the second support structure 12B, it is also preferable to form a curved contact face, contacting with the second member 21B, at the tip of the male screw 40A of the positioning bolt 40. Especially in case of the second support structure 12B, a force can be transferred stably even when an inclined angle of the positioning bolt 40 has changed along with a relative change between positions of the gradient coil 11 and the magnet 4. Therefore, in the illustrated example, the tip of the male screw 40A has a convex shape which is a part of a spherical face. On the contrary, a portion of the second member 21B contacting with the tip of the male screw 40A has a concave shape which is a part of a spherical face.

Furthermore, it is also preferable to use the vibration-proof material 29 for at least a part of the second support structure 12B, similarly to the first support structures 12A. In addition, a member contacting with the magnet 4 are desirable to be made with the nonconductive material 30. In the illustrated example, the vibration-proof material 29 is used as a part between the first member 20B and the positioning nut 41, and as the face forming the through hole of the first member 20B. Furthermore, the second member 21B contacting with both of the internal cylinder member 4B and the end face member 4C of the magnet 4 is made with the nonconductive material 30.

The second support structure 12B which has the above-mentioned structure can be used in combination with at least one of the first support structure 12A and the support structure 12 having another structure. Alternatively, a single or a plurality of the second support structures 12B may also be used independently. On the contrary, only the first support structures 12A may be used without using the second support structure 12B.

Especially, when the second support structure 12B is used together with the first support structure 12A which applies a strong holding force of the gradient coil 11 in the Z-axis direction, the second support structure 12B may have a structure by which a force acts only in a radial direction perpendicular to the Z-axis direction so that an excess force may not act in the Z-axis direction. In that case, the second member 21B has only to have a shape contacting with the internal cylinder member 4B of the magnet 4 only in the thickness direction, for example. In other words, the second member 21B has only to contact with only the inside face of the magnet 4 to apply a load on the magnet 4. This is similar when a holding force of the gradient coil 11 in the Z-axis direction is enough by combined use of the support structure 12 having another structure.

Furthermore, when a holding force of the gradient coil 11 in a radial direction perpendicular to the Z-axis direction is enough by the second support structure 12B, placing the support members 27 for supporting the load of the gradient coil 11 can be omitted. In this case, the number of components for placing the gradient coil 11 can be reduced.

Next, another example of detailed structure of the support structure 12 will be described.

Figure 9:
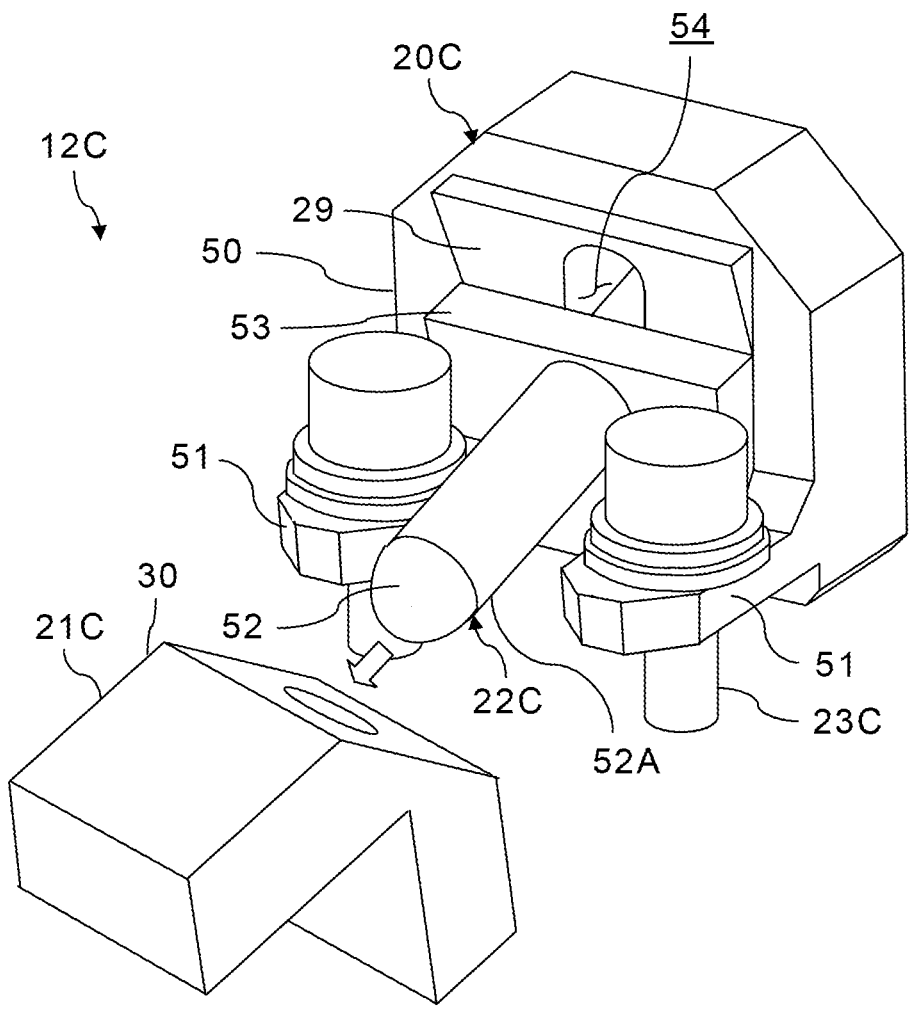
FIG. 9 is a perspective view showing another example of detailed structure of the support structure shown in FIG. 1.
Figure 10:
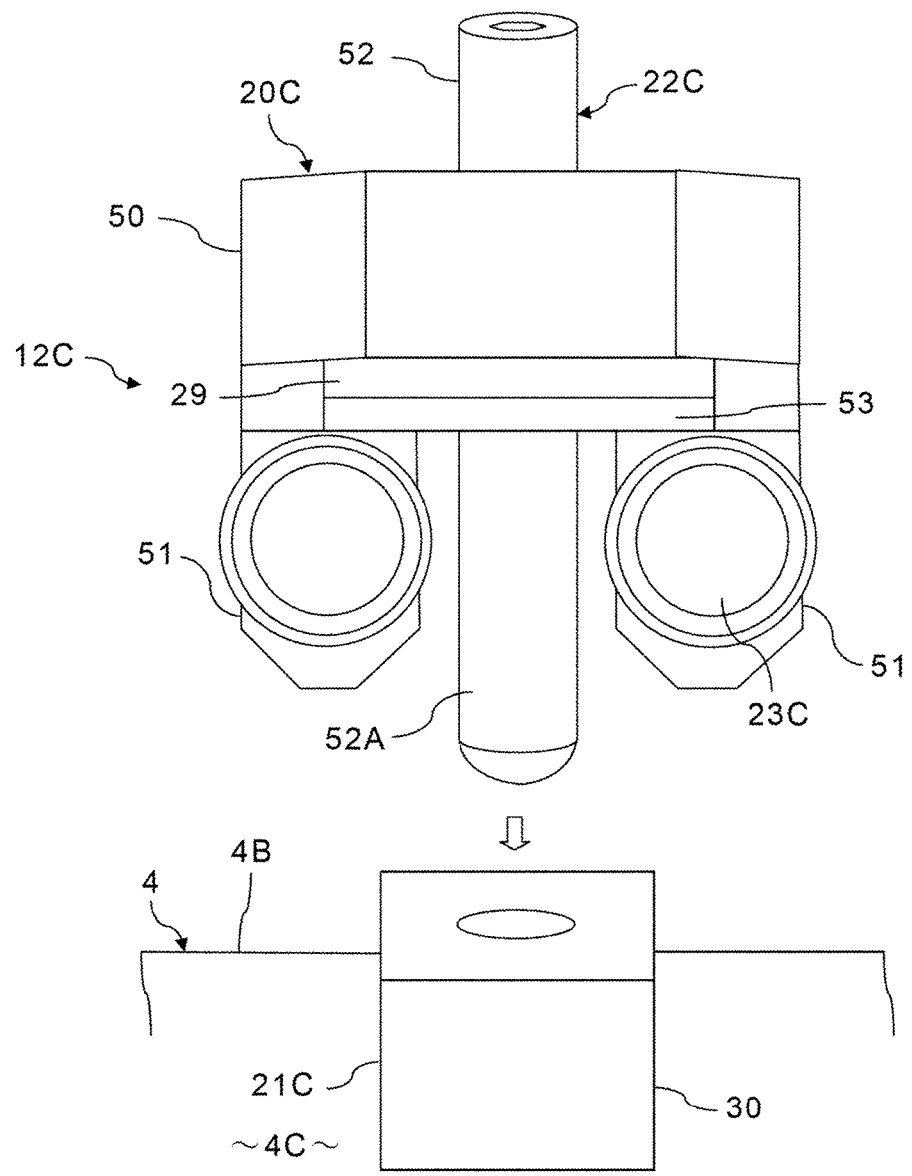
FIG. 10 is a top view of the third support structure shown in FIG. 9.
Figure 11:
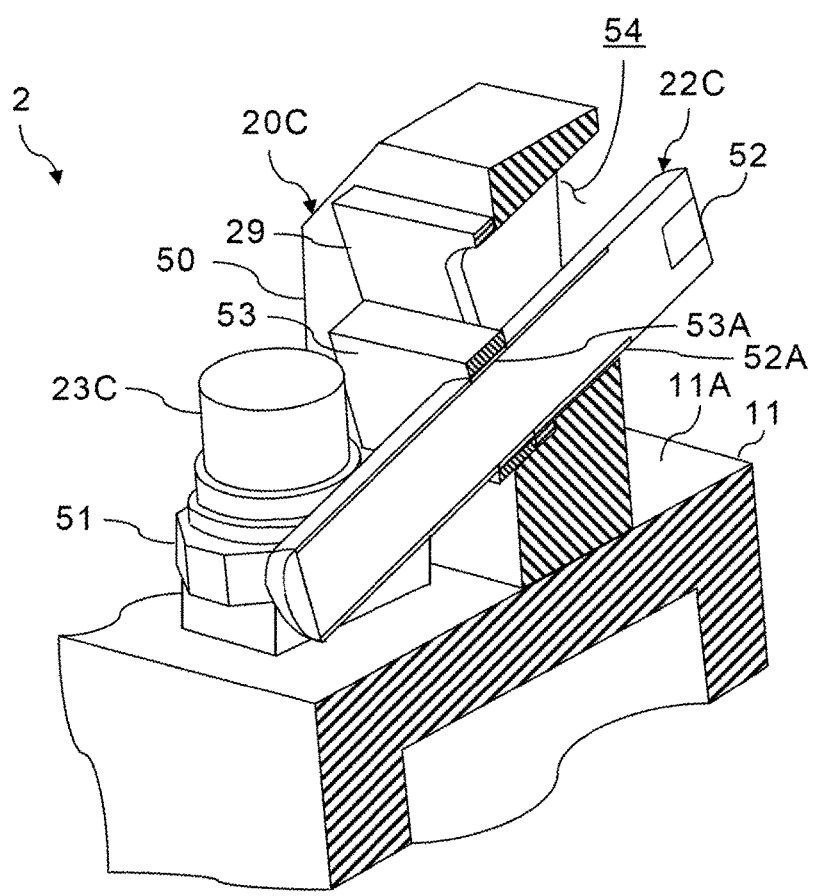
FIG. 11 is a sectional view of the first member of the third support structure shown in FIG. 9 as viewed from an oblique direction.

FIG. 9 is a perspective view showing another example of detailed structure of the support structure 12 shown in FIG. 1, FIG. 10 is a top view of the third support structure 12C shown in FIG. 9, and FIG. 11 is a sectional view of the first member 20C of the third support structure 12C shown in FIG. 9 as viewed from an oblique direction.

The third support structure 12C can also be composed of the first member 20C, the second member 21C and a positioning structure 22C. The first member 20C is fixed to the gradient coil 11 side in an arbitrary method. In the illustrated example, the first member 20C has been fastened to the gradient coil 11 side by bolts 23C.

The first member 20C has a structure forming two platy arms 51 on a main block 50. Each arm 51 has a female screw for fastening the bolt 23C. Preferably, each arm 51 is configured to be able to deform elastically by lengthening the arm 51 enough. Thereby, a vibration can be absorbed by an elastic function of each arm 51. Note that, an elastically deformable portion for absorbing a vibration can be formed on the first member 20C, not limited to the illustrated example but also by a variety of aspects.

The second member 21C is connected with the edge inside the wall forming the magnet 4. The second member 21C may be fixed to the edge of the magnet 4 or arranged in contact with the edge of the magnet 4. Alternatively, the second member 21C may be integrally formed as a part of the wall of the magnet 4.

The positioning structure 22C can be composed of a positioning bolt 52 and a positioning nut 53. The first member 20C has a long hole 54 for inserting the positioning bolt 52 toward the second member 21C. Meanwhile, the second member 21C has a concave part for receiving the tip of the positioning bolt 52 inserted in an oblique direction from the central axis of the magnet 4.

Then, the positioning bolt 52 is inserted in the long hole 54 of the first member 20C. Furthermore, a male screw 52A of the positioning bolt 52 is fastened with a female screw 53A of the positioning nut 53. The tip of the positioning bolt 52 protruding from the positioning nut 53 is contacted with the concave part of the second member 21C. Therefore, the more the positioning nut 53 is fastened, the longer a protrusion length of the positioning bolt 52 becomes. As a result, the second member 21C is pressed by the positioning bolt 52 with a strong force from an oblique direction.

Therefore, according to the third support structure 12C, the gradient coil 11 can be held in the magnet 4 by a principle similar to that of the second support structure 12B. Hence, the third support structure 12C can also obtain functions, including the centering function of the gradient coil 11, similar to those of the second support structure 12B.

The third support structure 12C is also an example of movable structure which moves the first member 20C. That is, the female screw 53A of the positioning nut 53 included in the first member 20C side and the male screw 52A of the positioning bolt 52, which is fastened with the female screw 53A and contacts with the second member 21C, are an example of movable structure for positioning the first member 20C relative to the second member 21C at least in the central axis direction of the gradient coil 11 and the magnet 4. As described above, the third support structure 12C can also adjust a position of the gradient coil 11 by adjusting a fastening amount of the positioning bolt 52 and the positioning nut 53.

The tip of the male screw 52A has a convex shape which is a part of a spherical face, similarly to that of the second support structure 12B. On the contrary, the portion of the second member 21C contacting with the tip of the male screw 52A has a concave shape which is a part of a spherical face.

It is also preferable to use the vibration-proof material 29 for at least a part of the third support structure 12C. Furthermore, a member contacting with the magnet 4 is preferable to be made with the nonconductive material 30. In the illustrated example, a sheet-like vibration-proof rubber is used as the vibration-proof material 29 between the positioning nut 53 and the first member 20C. Furthermore, the second member 21C is made with the nonconductive material 30.

In the third support structure 12C, the hole for inserting the male screw 52A of the positioning bolt 52 in the first member 20C is a long hole 54. Namely, the first member 20C has the long hole 54 for inserting the male screw 52A. Therefore, the position of the gradient coil 11 can be adjusted by adjusting the position of the positioning bolt 52 relative to the first member 20C.

Figure 12:
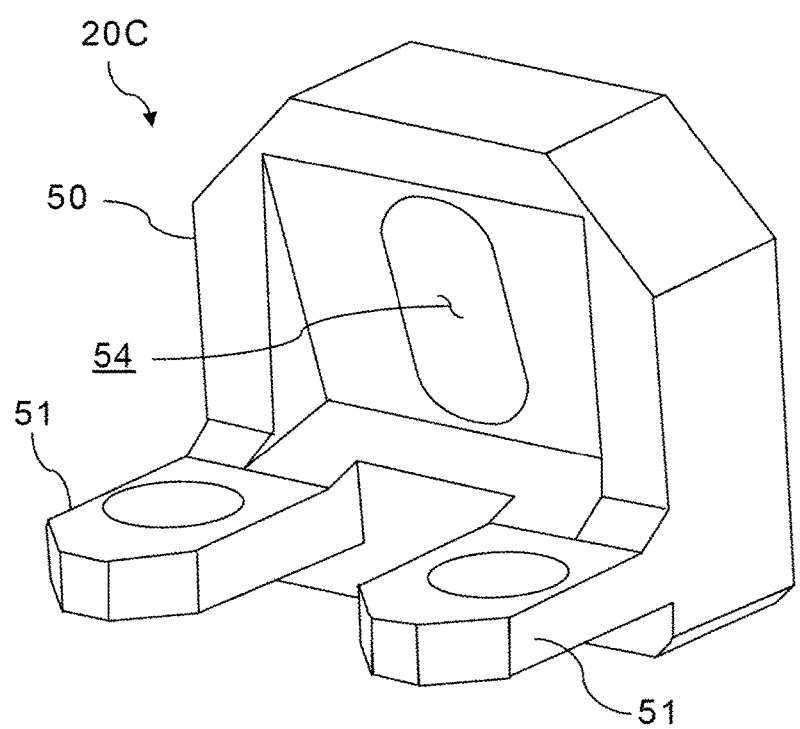
FIG. 12 is a perspective view showing an example of the long hole formed in the third support structure shown in FIG. 9.
Figure 13:
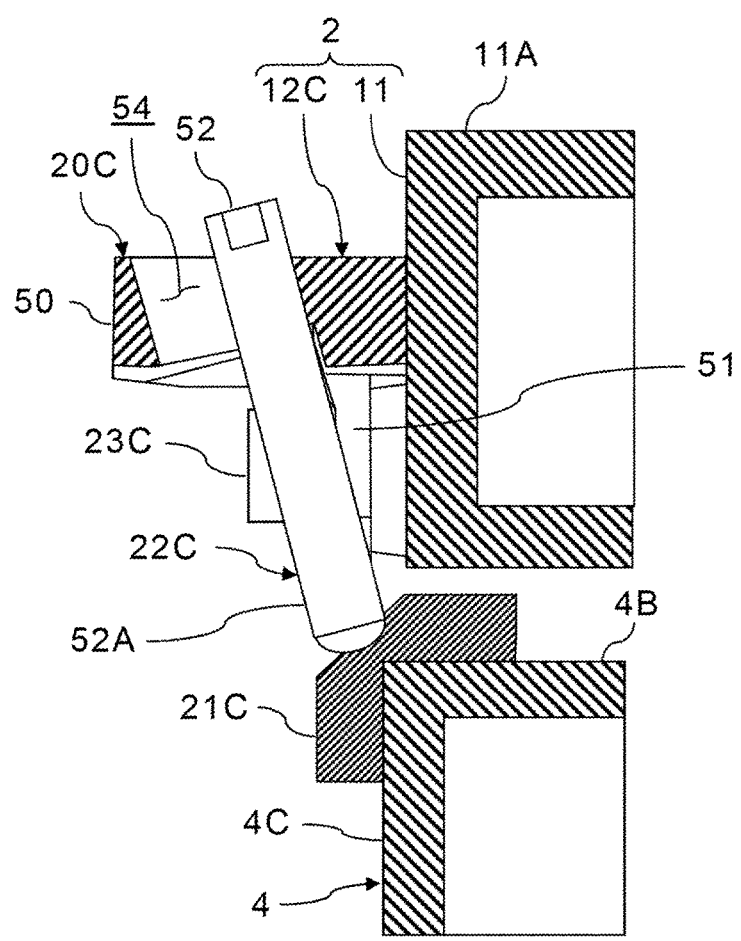
FIG. 13 shows an example of giving an offset in the positive direction to a position of the gradient coil using the long hole shown in FIG. 12.
Figure 14:
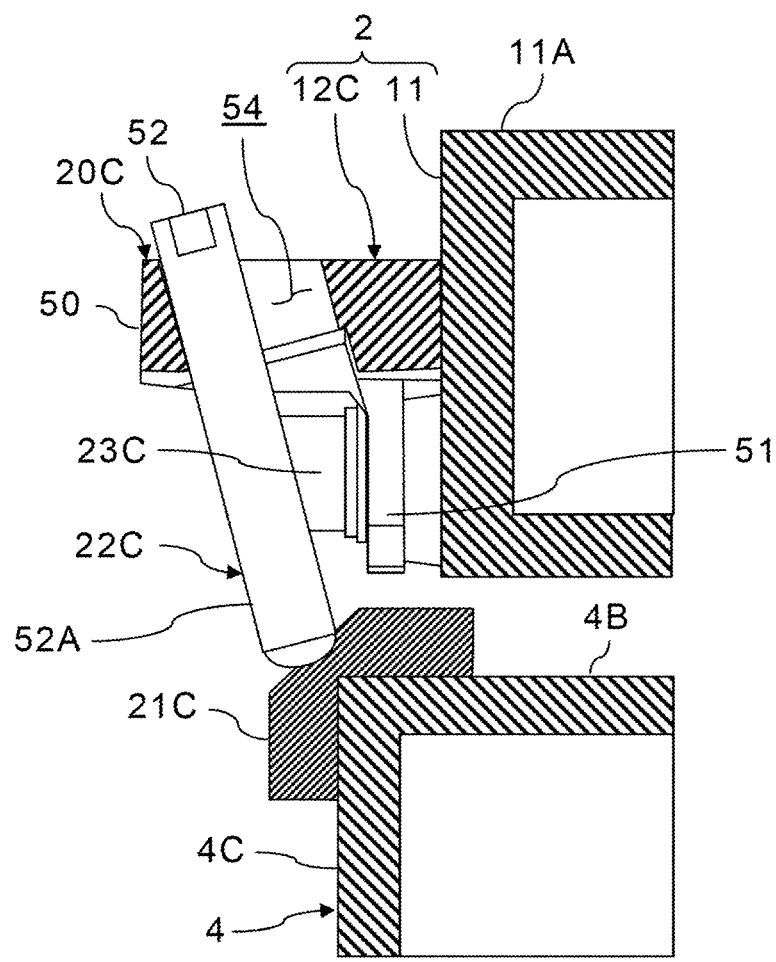
FIG. 14 shows an example of giving an offset in the negative direction to a position of the gradient coil using the long hole shown in FIG. 12.

FIG. 12 is a perspective view showing an example of the long hole 54 formed in the third support structure 12C shown in FIG. 9, FIG. 13 shows an example of giving an offset in the positive direction to a position of the gradient coil 11 using the long hole 54 shown in FIG. 12, and FIG. 14 shows an example of giving an offset in the negative direction to a position of the gradient coil 11 using the long hole 54 shown in FIG. 12. Note that, illustration of the positioning nut 53 and the vibration-proof material 29 are omitted in FIG. 13 and FIG. 14.

When the position of the positioning bolt 52 of the third support structure 12C attached to the gradient coil 11 in the positive side of the Z-axis direction is set to be in the gradient coil 11 side in the long hole 54, as shown in FIG. 13, the position of the gradient coil 11 can have an offset in the positive side of the Z-axis direction. On the contrary, when the position of the positioning bolt 52 is set to be in the side far from the gradient coil 11 in the long hole 54, as shown in FIG. 14, the position of the gradient coil 11 can have an offset in the negative side in the Z-axis direction.

The third support structure 12C which has the above-mentioned structure can be used independently or in combination with the support structure 12 having another structure. For example, the third support structure 12C may also be used as a substitute for the second support structure 12B used in combination with the first support structure 12A.

The gradient coil unit 2 as mentioned above is configured to support the gradient coil 11 by the support structures 12 using the internal cylinder of the magnet 4 having a high rigidity.

Therefore, propagation of a vibration generated in a gradient coil can be suppressed compared to the conventional case where a gradient coil is supported using each end plate of a magnet having a low rigidity. As a result, an undesired sound due to a sympathetic vibration of a gradient coil and a magnet can be avoided. Especially, a resonant frequency of an end part forming a vacuum case of a magnet tends to become low since a rigidity of the end part is low. Therefore, when a driving frequency of a gradient coil agrees with a resonant frequency of an end face of a magnet, a loud noise and a large vibration are caused by a very large resonance magnification.

By contrast, according to the gradient coil unit 2, the gradient coil 11 is supported using each end part, having a high rigidity, of the internal cylinder of the magnet 4. Therefore, a resonant frequency becomes high and a vibration magnification in a low frequency becomes small. As a result, a vibration transmitted to the magnet can decrease and a noise emitted from the magnet can be reduced. In addition, a vibration transmitted to an object O can also be reduced.

Furthermore, a load applied to each end face of the magnet decreases. Therefore, a thickness of each end plate of the magnet can be made thinner than the conventional one. As a result, a reduction effect in costs can also be expected.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A gradient coil unit comprising:
    a tubular gradient coil configured to apply a gradient magnetic field to an imaging region of a magnetic resonance imaging system; and
    support structures, fixed to plural positions of said gradient coil, configured to hold said gradient coil on a tubular magnet by applying pressing forces on positions of an edge inside a wall forming the magnet, the pressing forces each having a component in a central axis direction of the magnet.

2. A gradient coil unit of claim 1, wherein at least one of said support structures is configured to apply a pressing force in the central axis direction of the magnet.

3. A gradient coil unit of claim 1, wherein at least one of said support structures is configured to apply a pressing force at an inclined angle from the central axis direction of the magnet.

4. A gradient coil unit of claim 1, wherein at least one of said support structures is configured to apply a pressing force on an end part of at least one of an internal cylinder member and an end face which form the magnet.

5. A gradient coil unit of claim 1,
    wherein at least one of said support structures is configured to apply a pulling force on said gradient coil, the pulling force having a component in the central axis direction.

6. A gradient coil unit of claim 1, wherein said support structures are configured to adjust a position of said gradient coil.

7. A gradient coil unit of claim 1,
    wherein at least one of said support structures is configured to include a vibration-proof material in at least a part thereof.

8. A gradient coil unit of claim 1,
    wherein a member of at least one of said support structures includes a non-conductive material, contacting the magnet.

9. A gradient coil unit of claim 1, wherein at least one of said support structures has:
    a first member fixed to a side of said gradient coil;
    a second member contacting with the edge or connected with the edge of the magnet; and
    a movable structure configured to adjust a position of said first member, with respect to said second member, at least in the central axis direction.

10. A gradient coil unit of claim 1, wherein at least one of said support structures has:
    a first member fixed to a side of said gradient coil;
    a second member contacting with the edge or connected with the edge of the magnet;
    a female screw formed in said first member side; and
    a male screw fastened with said female screw and having a curved contact face at a tip, the contact face being contacting with said second member.

11. A gradient coil unit of claim 1, wherein at least one of said support structures has:
    a first member fixed to said gradient coil side and having an elastically deformable portion;
    a second member contacting with the edge or connected with the edge;
    a female screw formed in said first member side; and
    a male screw fastened with said female screw and contacting with said second member.

12. A gradient coil unit of claim 1, wherein at least one of said support structures has:
    a first member fixed to a side of said gradient coil;
    a second member contacting with the edge or connected with the edge of said magnet;
    a female screw formed in said first member; and
    a male screw fastened with said female screw and contacting said second member,
    wherein said first member has an elongated hole disposed to receive said male screw therethrough.

13. A magnetic resonance imaging apparatus comprising: a gradient coil unit of claim 1, a static field magnet and at least one radio frequency coil configured to perform magnetic resonance imaging of an object.

* * * * *